US005386169A

United States Patent [19]

Dubruque

[11] Patent Number: 5,386,169

[45] Date of Patent: Jan. 31, 1995

[54] DEVICE FOR CAUSING AN UNTUNED STRUCTURE TO VIBRATE ULTRASONICALLY

[76] Inventor: Dominique Dubruque, 644 chemin des Farnaises, 74380 Bonne-Sur-Menoge, France

[21] Appl. No.: 90,134

[22] PCT Filed: Jan. 16, 1992

[86] PCT No.: PCT/FR92/00033

§ 371 Date: Jul. 19, 1993

§ 102(e) Date: Jul. 19, 1993

[87] PCT Pub. No.: WO92/12807

PCT Pub. Date: Aug. 6, 1992

[30] Foreign Application Priority Data

Jan. 17, 1991 [FR] France ................................ 91-00496

[51] Int. Cl.[6] ............................................ H01L 41/08

[52] U.S. Cl. .................................... 310/323; 310/325; 209/346; 209/365.1

[58] Field of Search ............... 310/323, 325, 316, 317; 318/116; 239/102.2; 209/364, 365.1, 346, 368; 74/155; 116/DIG. 19

[56] References Cited

U.S. PATENT DOCUMENTS

| | | | |
|---|---|---|---|
| 3,027,690 | 4/1962 | Roney | 310/325 |
| 3,117,768 | 1/1964 | Carlin | 310/334 |
| 3,173,043 | 3/1965 | Dickey et al. | 310/323 |
| 3,628,071 | 12/1971 | Harris et al. | 310/8.2 |
| 4,019,683 | 4/1977 | Asai et al. | 310/325 X |
| 4,034,244 | 7/1977 | Asai et al. | 310/325 X |
| 4,074,152 | 2/1978 | Asai | 310/334 |
| 4,490,640 | 12/1984 | Honda | 310/325 |
| 4,620,121 | 10/1986 | Mishiro | 310/323 |
| 5,143,222 | 9/1992 | Monteith | 310/325 X |
| 5,270,484 | 12/1993 | Tsuchiya et al. | 310/323 X |

FOREIGN PATENT DOCUMENTS

| | | |
|---|---|---|
| 2233108 | 10/1975 | France . |
| 2424007 | 11/1975 | Germany . |
| 3813176 | 4/1988 | Germany . |
| 2167270 | 5/1986 | United Kingdom . |

*Primary Examiner*—Mark O. Budd
*Attorney, Agent, or Firm*—Jacobson, Price, Holman & Stern

[57] ABSTRACT

The present invention relates to the vibration of an untuned structure by means of an ultrasound converter. The main but not unique purpose is to cause a filtering cloth, a perforated metal sheet or a screening mesh to vibrate in order to improve the flow rate in the filtering or sieving process, with equal surface energy, without clogging the mesh or harming the product being processed. The device according to the invention is characterized in that it comprises at least one electro-acoustic converter (12) ridigly fixed to said structure (10) by means of metallic securing elements (14) tuned to the frequency of the converter, the links with the structure being in a maximum region of amplitude (V)j of said securing elements and resonance of the assembly being provided by a nut or any metallic unit tuned as an integral multiple of a half wave length.

15 Claims, 8 Drawing Sheets

DEVICE FOR CAUSING AN UNTUNED STRUCTURE TO VIBRATE ULTRASONICALLY

The present invention concerns a device for causing one or more untuned structures to vibrate ultrasonically. These structures may be of very different types, but the present description will be essentially limited to a screening structure, although this must not be interpreted as limiting the present invention.

It has been known for many years that causing a screen to vibrate ultrasonically effects a qualitative and quantitative improvement in the screening of fine powders or fine materials considered difficult to process.

Consider for example the problems encountered with mineral, metal and ceramic powders, with particle sizes in the order of one micron and less, and with spheroidal granules which tend to clog the screens. Ultrasonic techniques have already been described in the literature of this art and in particular in the work entitled Crowford Engineering of Frederick and Co.

The state of the art is also shown by FR-A-2 233 108 which describes screening equipment provided with an ultrasonic transducer in direct contact with the filter cloth.

Note that a device of this kind is restricted to circular screens. As ultrasound is emitted from a single anchor point the mesh is subject to non-negligible stresses at this level which may cause premature wear and consequential pollution of the product treated.

In the case of a multistage screen the number of transducers must be multiplied commensurately and this complicates the construction. This prior art device has another drawback in that, in all cases, the converter is exposed to direct contact with the treated product and must usually be sealed.

The document DE-A-38 13 178 discloses a device for causing to vibrate at an ultrasonic frequency a structure comprising at least one electro-acoustic converter adapted to vibrate in a given vibration direction and fixed rigidly to said structure by means of metal fixing members tuned to the converter frequency, the links with the structure being in a region of maximum amplitude of said fixing members.

An object of the present invention is to provide an ultrasonic vibrator device which circumvents all the drawbacks of the prior art devices.

The main aim of the present invention is to render a support structure resonant. This is, for example, a filter cloth, membrane or other plate support which is not resonant in itself at the frequency of the ultrasonic emitter.

Another aim of the ultrasonic device in accordance with the invention is to optimize the ultrasonic efficiency regardless of the shape and size of the structure to be caused to vibrate. Naturally a main objective of the present invention is to prevent direct contact of the ultrasonic transducer with the filter cloth or membrane. In the case of a screen, the device in accordance with the invention excites the mesh by means of ultrasonic energy previously distributed in its supporting frame, so minimizing stresses at the anchor points. Finally, as explained in more detail later in this description, the ultrasonic device in accordance with the invention may be fitted to existing structures by modifying the geometrical shape of coupling members tuned to integer multiples of the half-wavelength at the output frequency.

In accordance with the present invention these objectives are achieved by a device for causing an untuned structure to vibrate at an ultrasonic frequency which is characterized in that it comprises at least one electro-acoustic converter fixed rigidly to said structure by means of metal fixing members tuned to the frequency of the converter, the structural couplings being located in a maximum amplitude region of said fixing members and the assembly being made resonant by fixing a nut or any other metal assembly tuned to an integer multiple of the half-wavelength.

Other features and advantages of the present invention will emerge from the following detailed description with particular reference to embodiments shown in the appended drawings in which.

It will be remembered that one essential aim of the ultrasonic device in accordance with the invention is to be readily adaptable to different types of already existing structures and to structures having shapes and sizes dependent on their application. The ultrasonic device in accordance with the invention achieves this objective in the two embodiments diagrammatically represented in FIGS. 1 and 2.

In the figures this structure 10 is shown schematically. It is any untuned structure, for example a structure supporting any operative unit such as a filter cloth.

The ultrasonic device in accordance with the invention comprises an electro-acoustic converter 12 which must be fixed rigidly to said structure 10. In all the embodiments described the links with the structure 10 are in a region of maximum amplitude V.

Fixing is by means of metal members which are tuned to the frequency of the converter, the length of said members including the thickness of the lugs joining them to the structure 10. In the embodiments shown in FIGS. 1 and 2 the metal fixing members are coupling bars 14 disposed between two facing walls of the structure 10.

These metal fixing members must naturally be tuned to the frequency of the converter. In this instance their length is half the wavelength at the output frequency of the ultrasonic converter, resonance of the assembly requiring the presence of a nut or any other metal member tuned to the operating frequency extending the coupling members. The ultrasonic converter may comprise one or more emitters of any kind, for example electrostrictive, magnetostrictive, electrocapacitative or piezo-electric emitters.

Note that the coupling bars have an exterior surface whose profile matches the specific dimensional configuration of the structure and is compatible with the required frequency of resonance.

Figure 1:
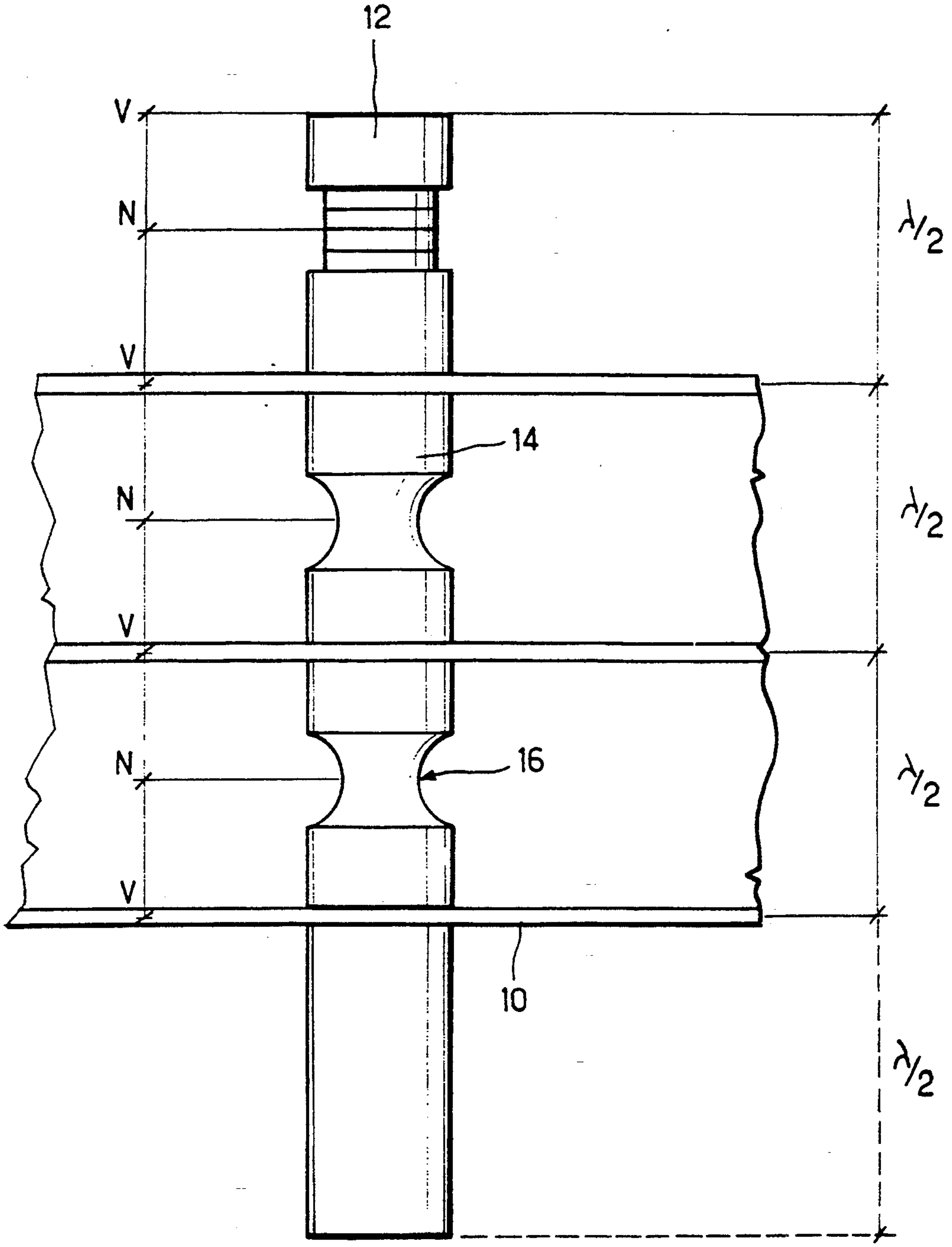
FIGS. 1 and 2 show two different types of coupling bar profile for matching dimensional constraints of a structure to be caused to vibrate whilst achieving the required resonant frequency.

The ultrasonic device of FIG. 1 illustrates one manner of operating at the half-wavelength at the frequency of the converter 12. In the FIG. 1 embodiment the exterior surface of the coupling bars 14 has, in the vicinity of their nodal area, a radial contraction 16 which has symmetry of revolution about the axis of said bars 14.

This specific embodiment, in which the coupling bars have a contraction in the vicinity of their nodal zone because of the presence of a groove 16 or the like, reduces the size of the coupling bars 14 without this becoming incompatible with resonance.

Figure 2:
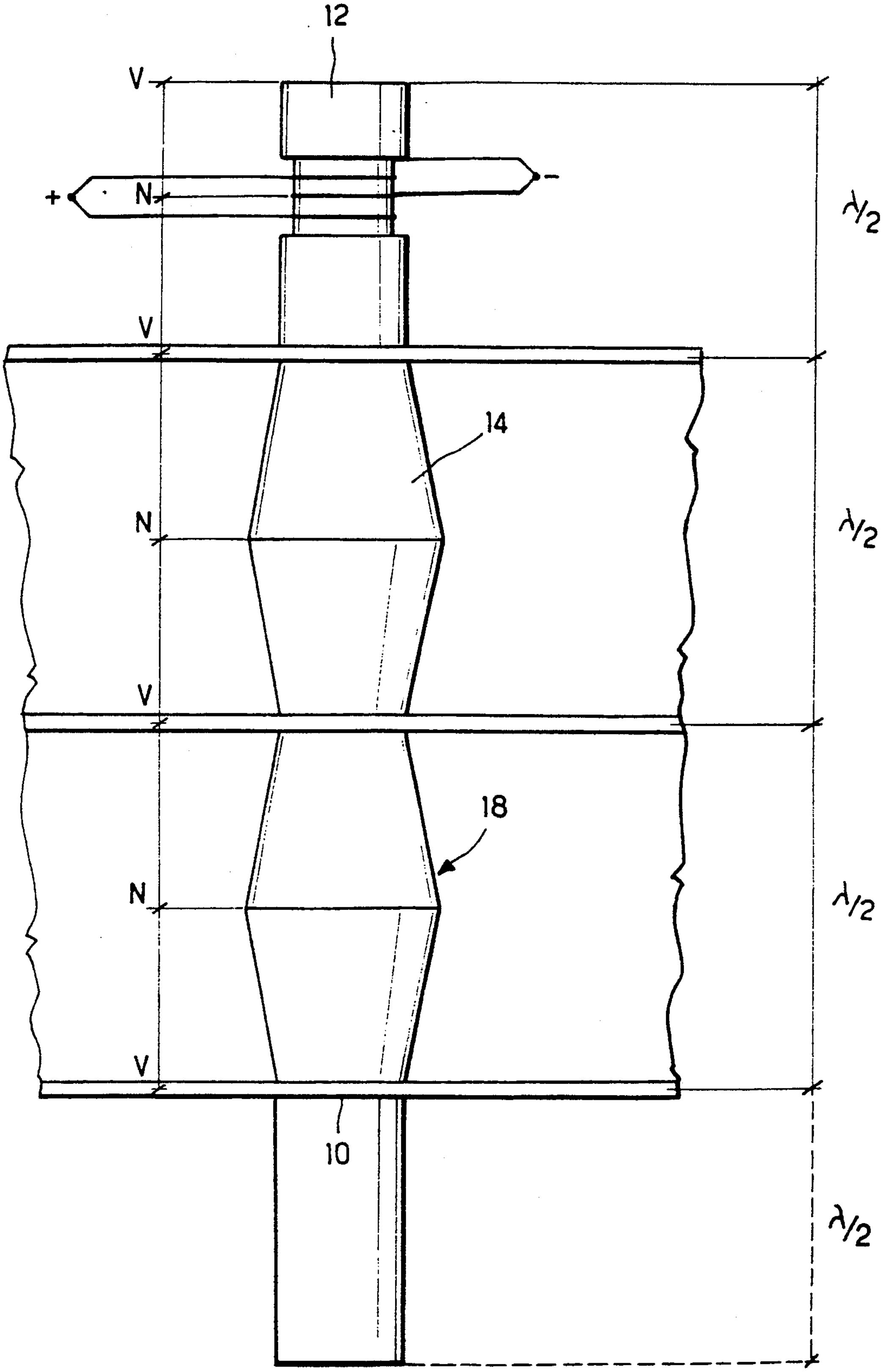

On the other hand, the embodiment shown in FIG. 2 employs coupling bars 14 whose exterior surface has, in the vicinity of their nodal zone, a radial enlargement 18 which also has symmetry of revolution about the axis of the bars 14.

The specific profile adopted in the FIG. 2 embodiment enables the length of the coupling bars 14 to be increased in a manner that is compatible with the frequency of the converter 12.

Figure 3:
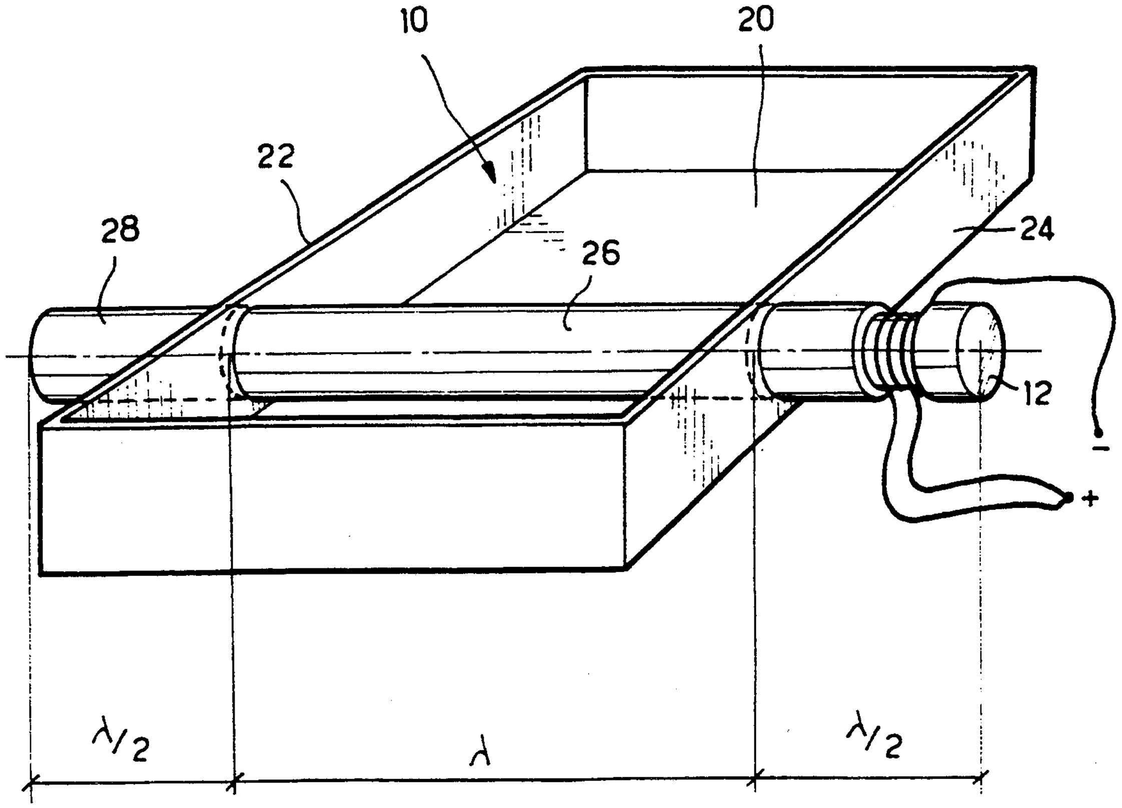
FIGS. 3 through 8 show various embodiments for causing single or multiple structures of various shapes to vibrate ultrasonically.

FIG. 3 shows how a support frame 10 holding a filter cloth 20 is caused to vibrate. The vibrator device is fixed to two opposite sides 22, 24 of the support frame 10. In this configuration the electro-acoustic device deployed comprises a unidirectional converter 12, a coupling bar 26 which is tuned to an integer multiple of half the wavelength and a nut 28 which is also tuned to half the wavelength. Note that the vibrator assembly is fixed to the support frame 10 in a region of maximum amplitude. The various members, namely the converter 12, the coupling bar 26 and the tuned nut 28, are advantageously screwed together through holes in facing parts of the support 10. Note, however, that the vibrator device may be rigidly fastened to the structure 10 by any other appropriate means, the essential requirement being to obtain a totally rigid coupling between the structure and the vibrator device. The various units may be force-fitted together, or adhesively bonded and/or welded together, for example.

In the FIG. 3 embodiment the holes receiving the screwthreads coupling together the converter 12, the coupling bar 26 and the tuned nut 28 may be replaced by slots opening onto the upper edge of the members 22 of the support frame. The areas of reduced cross-section where the various members 12, 26 and 24 are coupled together may be force-fitted into said slots to provide the rigid coupling to the support frame 10.

Figure 4:
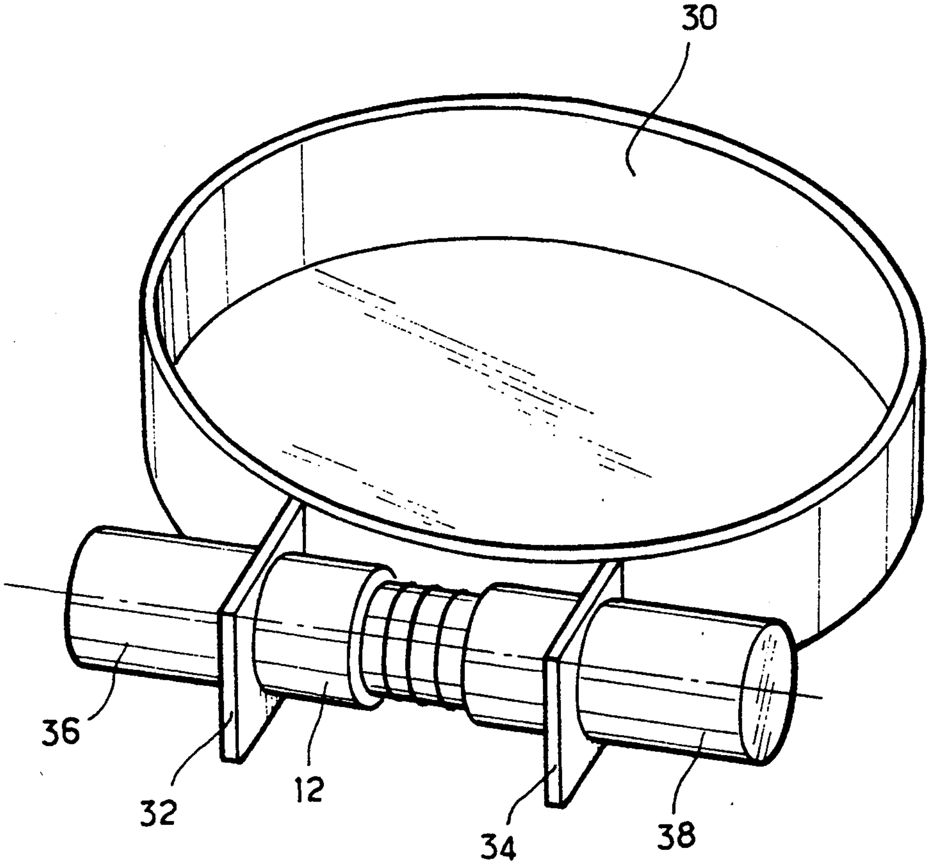

FIG. 4 shows another manner of causing an untuned circular structure 30 to resonate by means of fixing lugs 32 and 34 attached to the structure 30. In this specific embodiment two end bars 36 and 38 clamp the electro-acoustic assembly to the aforementioned fixing lugs 32 and 34. The coupling bars 36 and 38 are tuned to an integer multiple of the half-wavelength at the output frequency of the converter 12.

If necessary, the exterior surface of the coupling bars 36 and 38 may naturally have a profile matching the specific configuration of the frame 30 and compatible with the resonant frequency of the converter 12.

Figure 5:
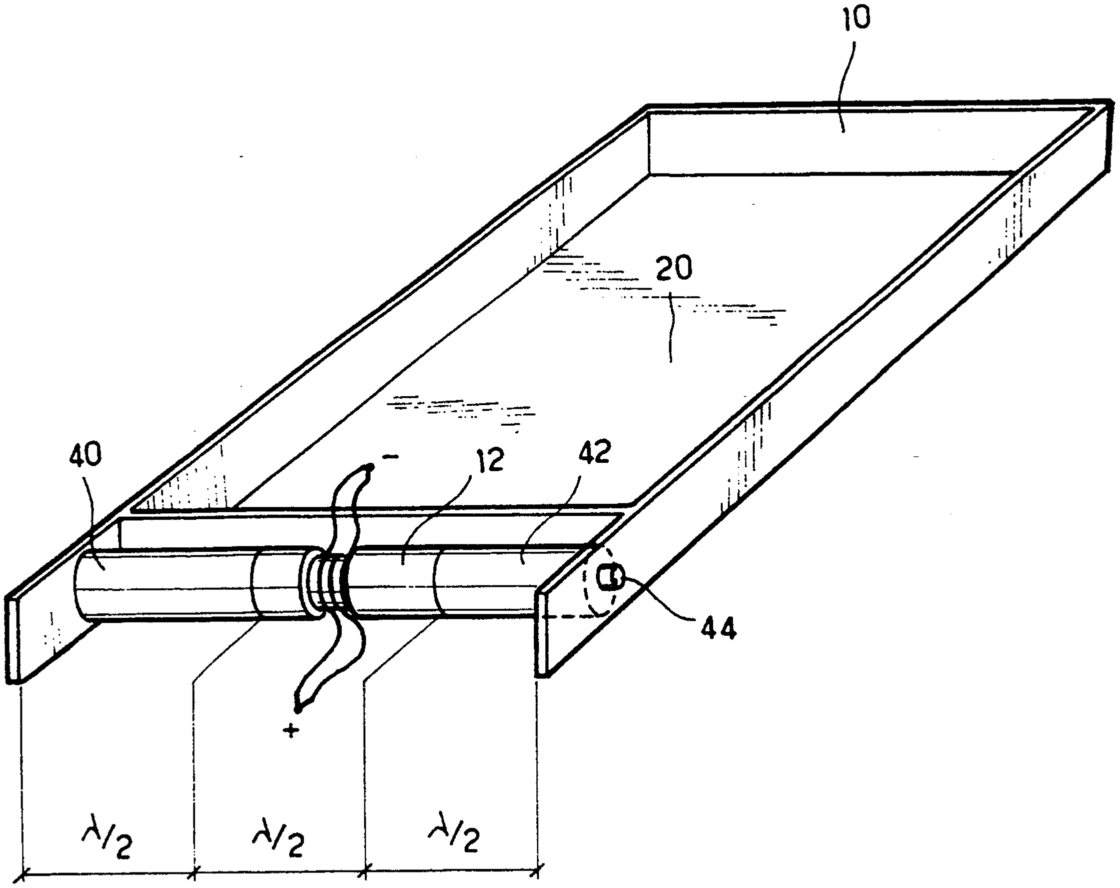

The embodiment shown in FIG. 5 is a variant of the device shown in FIG. 3. In this case, however, the electro-acoustic assembly comprising the converter 12 and the associated two coupling bars 40 and 42 is disposed outside the operative part of the support frame 10 carrying the filter cloth 20.

In this design the coupling bars 40, 42 may be welded or preferably screwed to the converter, the coupling to the extension of the support frame being advantageously achieved by screwing a tuned nut onto the screwthreaded end 44 of each coupling bar 40, 42.

Any appropriate rigid fixing means may be used, the essential requirement being to achieve good mechanical coupling between the frame 10 and the ultrasonic device of the invention. This specific embodiment, in which the ultrasonic device is disposed outside the working area of the structure 10, has the advantage that it can be used in a moist atmosphere, for example. Note also that this design enables the structure or even the combination of the structure and the electro-acoustic device to be disposed in a sealed chamber with a controlled gas atmosphere.

Figure 6:
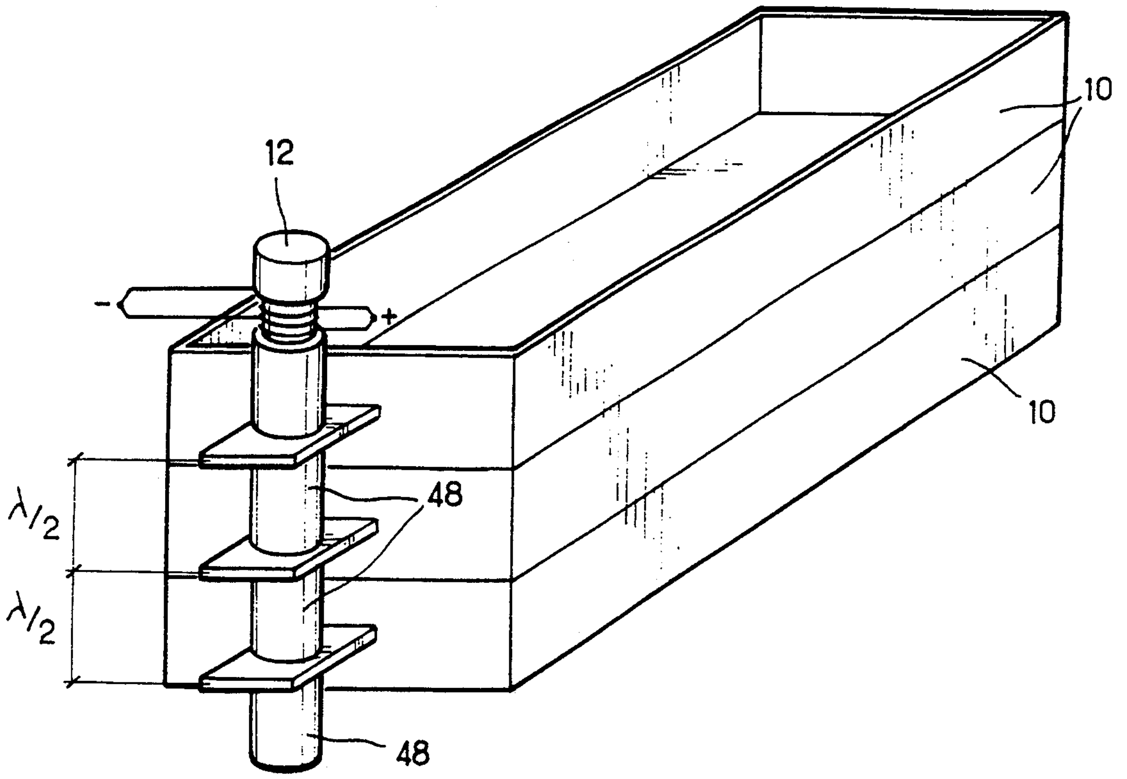

FIG. 6 shows an embodiment in which a converter 12 excites a stack of three identical structures 10 in the form of filter cloth support frames. In this type of configuration each structure 10 vibrates in its own mode and resonates with the ultrasonic emitter device. The coupling of the various structures 10 to the frame of the ultrasonic device is not rigid. An elastomer type material is advantageously used to fix the structure and to provide a seal between the stages. Each structure is coupled to the adjacent structure in the same way in order to preserve the phenomenon of acoustic resonance at each stage. The flexible coupling provided by the elastomer-based material provides a seal without clamping the various stages of the structure, which are therefore able to resonate. As in the embodiments previously described the converter 12 is attached to fixing lugs 46 by a plurality of coupling bars 48 preferably screwed together. Of course, according to the present invention the fixing members comprising the coupling bars are tuned to half the wavelength of the converter 12.

Figure 7:
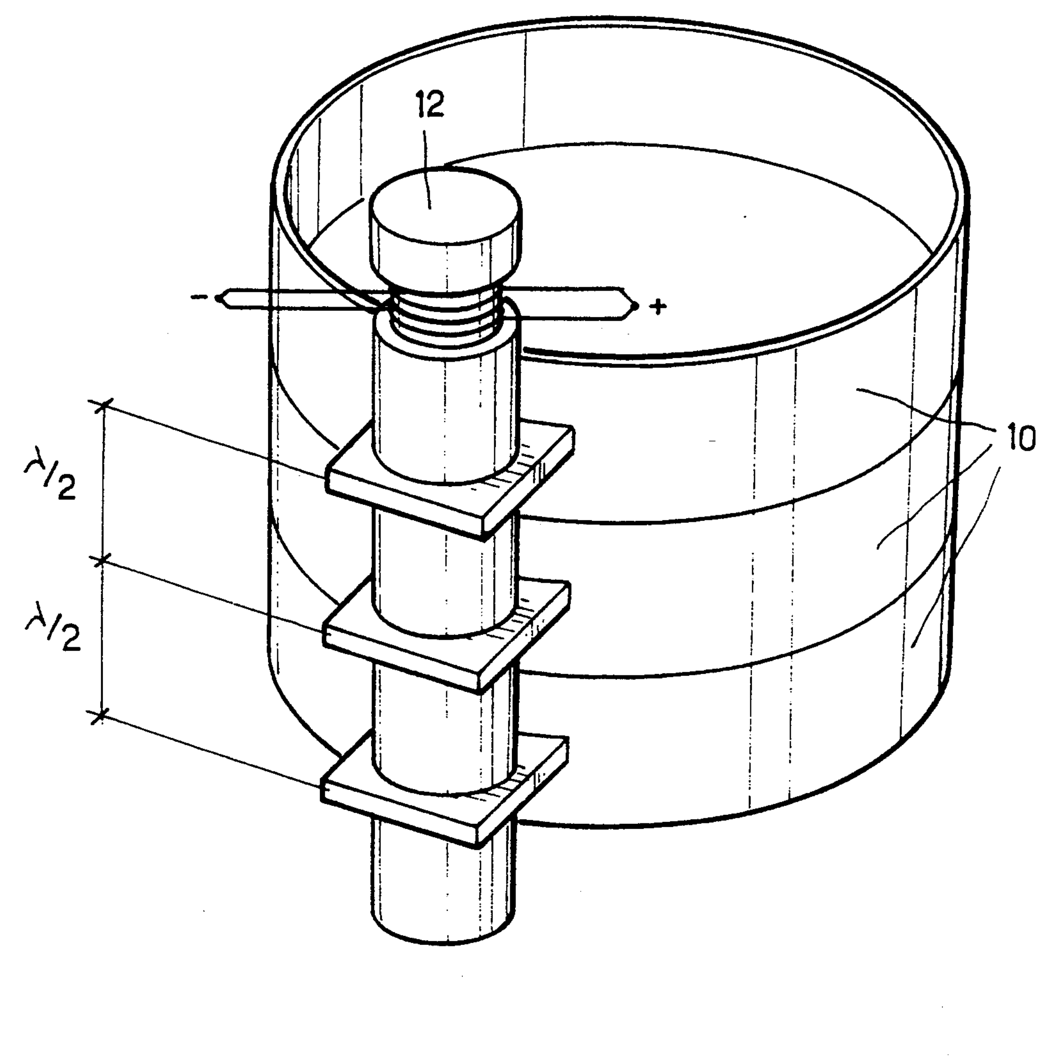
Figure 8:
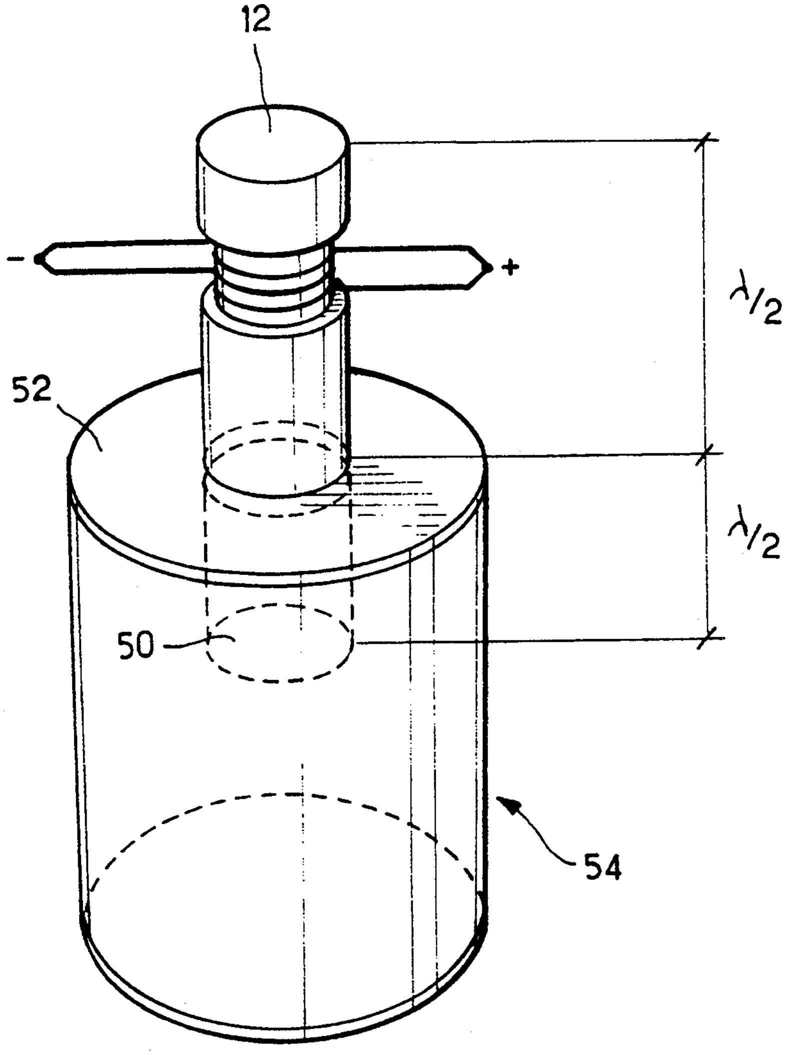

FIG. 7 shows another embodiment of a device for exciting a stack of untuned circular structures 10. The device shown is similar in every way to that shown in FIG. 6 except that the structures are of circular shape. Finally, FIG. 8 shows a final embodiment in which the vibrator device comprises an ultrasonic converter 12 screwed to a coupling bar 50 tuned to half a wavelength and clamping a circular plate 52 constituting the upper disk of a cylindrical drum 54 which is a support member of a mesh or filter, for example.

In all the embodiments previously described it may be advantageous to adapt the ultrasonic transmission members to the materials of the structure to be caused to vibrate acoustically. This can be achieved by matching the acoustic impedance. This prevents any heating at the connections and therefore can increase the electro-acoustic efficiency of the assembly caused to vibrate.

Also to enhance the performance of the ultrasonic device in accordance with the invention it may be advantageous to use two emission frequencies that are not in quadrature, so as to eliminate nodal zones from the working surfaces, on the vibrating cloth, for example. Using two ultrasonic members at frequencies that are not in quadrature, such as 20 and 30 kHz, for example, nodal zones on the filter cloth, which are inactive regions, are avoided.

Finally, note that the ultrasonic vibrator device in accordance with the invention may be used in conjunction with any low-frequency vibrator device commonly available. The emission of ultrasound communicated to the untuned structure may be continuous or pulsed. As previously mentioned, it may be superimposed on low-frequency vibration in the range from 100 to 3,000 vibrations/minute at amplitudes in the order of 1 to 30 mm and preferably in a range from 300 to 1,500 vibrations/minute at amplitudes in the order of 5 to 20 mm.

Depending on the specific application intended, symmetrical bidirectional or asymmetrical unidirectional electro-acoustic converters are used to emit the ultrasound. Also, the amplitude of the ultrasonic vibrations is matched to the product treated in said structure and is advantageously between 2 and 30 microns peak-to-peak and preferably between 5 and 20 microns peak-to-peak.

What is claimed is:

1. Device for causing an untuned screening structure to vibrate at an ultrasonic frequency comprising at least one electro-acoustic converter adapted to vibrate in a given vibration direction and fixed rigidly to said screening structure by metal fixing members tuned to the frequency of the converter, the couplings with the structure being disposed in a region of maximum amplitude of said fixing members, the metal fixing members being disposed in said vibration direction of the converter and, said structure being untuned at said ultrasonic frequency, the whole is caused to resonate by fixing a nut or any metal assembly tuned to an integer multiple of half the wavelength.

2. Ultrasonic device according to claim 1 characterized in that said metal fixing members comprise at least one bar (10) coupling to said structure (10) the exterior surface of which may be shaped to match any dimensional configuration of said structure whilst remaining compatible with the resonant frequency.

3. Ultrasonic device according to claim 2 characterized in that the exterior surface of the coupling bar has in the vicinity of its nodal zone a radial contraction which has symmetry of revolution about the axis of said bar.

4. Ultrasonic device according to claim 2 characterized in that the exterior surface of said bar has in the vicinity of its nodal zone a radial enlargement which has symmetry of revolution about the axis of said bar.

5. Ultrasonic device according to claim 1 characterized in that the operating frequency is between 10 and 100 kHz and preferably between 20 and 40 kHz.

6. Ultrasonic device according to claim 1 characterized in that the ultrasound emission is pulsed or continuous.

7. Ultrasonic device according to claim 1 characterized in that the amplitude of the ultrasonic vibrations is adapted to the product treated in said structure and is advantageously between 2 and 30 microns peak-to-peak and preferably between 5 and 20 microns peak-to-peak.

8. Ultrasonic device according to claim 1 characterized in that two emission frequencies not in quadrature are used simultaneously to eliminate nodal zones on the operative surface of said structure.

9. Ultrasonic device according to claim 1 characterized in that an ultrasonic converter causes to vibrate and resonate a stack of untuned structures fastened together at the points of connection to said electro-acoustic device.

10. Ultrasonic device according to claim 9 characterized in that said untuned structures vibrating and resonating are disposed in an enclosure adapted to contain a moist atmosphere.

11. Ultrasonic device according to claim 1 characterized in that the electro-acoustic/structure assembly is disposed in a sealed chamber.

12. Ultrasonic device according to claim 1 characterized in that the emission of ultrasound to the untuned structure is continuous or pulsed and superimposed on low-frequency vibration in the range of frequencies from 100 to 3,000 vibrations/minute for amplitudes in the order of 1 to 30 mm and preferably in the range of frequencies from 300 to 1,500 vibrations/minute for amplitudes of 5 to 20 mm.

13. Ultrasonic device according to claim 1 characterized in that the ultrasound is emitted by symmetrical bidirectional or asymmetrical unidirectional electro-acoustic converters.

14. Ultrasonic device according to claim 1 characterized in that said structure is a screening structure.

15. Device for causing a stack of untuned structure to vibrate and resonate at an ultrasonic frequency comprising one electro-acoustic converter adapted to vibrate in a given vibration direction and fixed rigidly to said structure by metal fixing members tuned to the frequency of the converter, the untuned structures being fastened together at the points of connection to said electro-acoustic device, the couplings with the structure being disposed in a region of maximum amplitude of said fixing members, the metal fixing members being disposed in said vibration direction of the converter, said structure being untuned at said ultrasonic frequency, the whole is caused to resonate by fixing a nut or any metal assembly tuned to an integer multiple of half the wavelength.

* * * * *